United States Patent
Yu et al.

(10) Patent No.: US 6,770,910 B2
(45) Date of Patent: Aug. 3, 2004

(54) THIN-FILM TRANSISTOR ARRAY STRUCTURE

(75) Inventors: Jian-Shen Yu, Hsinchu (TW); Wei-Chih Chang, Chupei (TW)

(73) Assignee: AU Optronics Corp., Hsinchu (TW)

(*) Notice: Subject to any disclaimer, the term of this patent is extended or adjusted under 35 U.S.C. 154(b) by 0 days.

(21) Appl. No.: 10/071,063

(22) Filed: Feb. 7, 2002

(65) Prior Publication Data

US 2002/0113238 A1 Aug. 22, 2002

(30) Foreign Application Priority Data

Feb. 19, 2001 (TW) .......................... 90103694 A

(51) Int. Cl.[7] .................. H01L 29/04; H01L 31/036; H01L 31/0376; H01L 31/20; H01L 29/15
(52) U.S. Cl. ..................... 257/72; 257/59; 438/139; 349/42; 349/43; 349/139; 349/143; 349/149
(58) Field of Search ................. 257/59, 72; 349/42, 349/43, 139, 143, 149; 438/139

(56) References Cited

U.S. PATENT DOCUMENTS

| | | | |
|---|---|---|---|
| 5,737,051 A | * | 4/1998 | Kondo et al. ............... 349/149 |
| 5,977,563 A | * | 11/1999 | Kubo et al. .................... 257/72 |
| 6,449,025 B2 | * | 9/2002 | Lee .............................. 349/129 |
| 6,462,798 B1 | * | 10/2002 | Kim et al. ................... 349/129 |
| 6,473,142 B2 | * | 10/2002 | Kim et al. ..................... 349/84 |

* cited by examiner

Primary Examiner—Nathan J. Flynn
Assistant Examiner—Victor A. Mandala, Jr.
(74) Attorney, Agent, or Firm—Ladas & Parry

(57) ABSTRACT

A TFT array structure comprises a Thin-Film Transistor, a data line, a scanning line, a pixel electrode and an auxiliary electrode. The data line is connected to the drain of the Thin-Film Transistor, and the scanning line is connected to the gate of the Thin-Film Transistor. The scanning line is oriented substantially orthogonally with respect to the data line to form a plurality of rectangular pixels in matrix. A predetermined electrode (source electrode or auxiliary electrode) is formed at the place where the pixel electrode is close to the edge of the data line, and that predetermined electrode is coupled to the pixel electrode and located at a mask on which the data line is located. It is also characterized that the capacitance-coupling effect generated between the pixel electrode and the data line is the same as that generated between the predetermined electrode and the data line. The performances of all pixels are uniform despite errors occurred during the aligning process on the pixel electrode.

17 Claims, 3 Drawing Sheets

THIN-FILM TRANSISTOR ARRAY STRUCTURE

BACKGROUND OF THE INVENTION

1. Field of the Invention

This invention relates to a Thin-Film Transistor array structure. More particularly, this invention relates to a Thin-Film Transistor array structure for sustaining all capacitance-coupling effects between a pixel electrode and a data line of a panel.

2. Description of Prior Art

For the manufacture of a Thin-Film Transistor (TFT) array of a panel, especially in the case of those with a larger size, the exposure process on the TFT has to be divided and proceeded by several steps.

However, the alignment of the layers between each two adjacent exposed blocks of the TFT is easily dislocated during the exposure process, and the capacitance-coupling effects between a pixel electrode and a data line on each of the adjacent exposed blocks are very different. Thus, the penetrating rates of each block of the TFT are different in typical TFT structures.

Referring to FIG. 1A, FIG. 1A is a plan view showing the structure of one pixel of typical TFT structure. Symbol "CE" represents a common electrode, symbol "SL" represents a scanning line, symbol "10" represents a TFT, and symbol "DL" represents a data line. The source electrode 12 of the TFT 10 is coupled to an ITO electrode (i.e. pixel electrode) 16 via a contact hole 14 formed on an isolated layer, and the data line DL is coupled to a drain electrode 18 of the TFT 10.

FIG. 1B is a cross-section according to a line I—I of FIG. 1A. A distance Δd existing between the data line DL and the ITO electrode 16 is formed during the exposure process and is an important parameter related to the capacitance-coupling effect of two adjacent blocks of the TFT 10. Once the distance Δd exceeds a predetermined value, the capacitance-coupling effect of the adjacent blocks is easily affected and causes a visible line on the panel.

SUMMARY OF THE INVENTION

To solve the above problem, the primary object of this invention is to provide a TFT array structure, which comprises a Thin-Film Transistor, a data line, a scanning line, a pixel electrode and an auxiliary electrode. The data line is connected to the drain of the Thin-Film Transistor, and the scanning line is connected to the gate of the Thin-Film Transistor. The scanning line is oriented substantially orthogonally with respect to the data line to form a plurality of rectangular pixels in matrix. The auxiliary electrode is formed at the place where the pixel electrode is close to the edge of the data line, and the auxiliary electrode is coupled to the pixel electrode and located at a mask on which the data line is located. The capacitance-coupling effect generated between the pixel electrode and the data line is the same as that generated between the predetermined electrode and the data line, and the performances of all pixels are uniform despite errors occurring during the aligning process on the pixel electrode.

BRIEF DESCRIPTION OF THE DRAWINGS

The present invention can be more fully understood by reading the subsequent detailed description and examples with reference made to the accompanying drawings in which.

DETAILED DESCRIPTION OF THE PREFERRED EMBODIMENTS

Figure 1A:
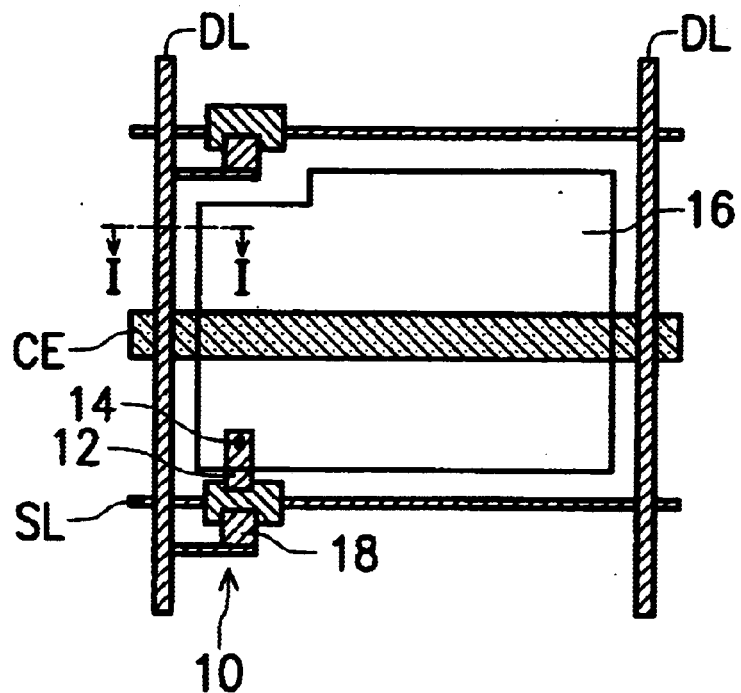
FIG. 1A is a plan view showing the structure of one pixel of a typical TFT structure.
Figure 1B:
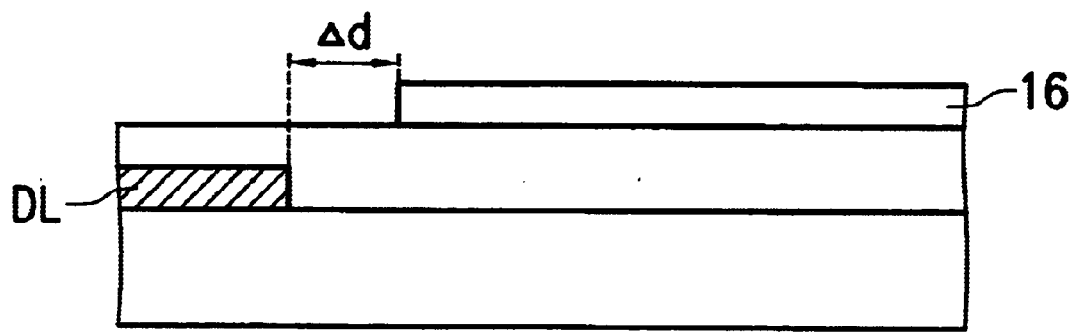
FIG. 1B is a cross-section according to a line I—I of FIG. 1A.
Figure 2A:
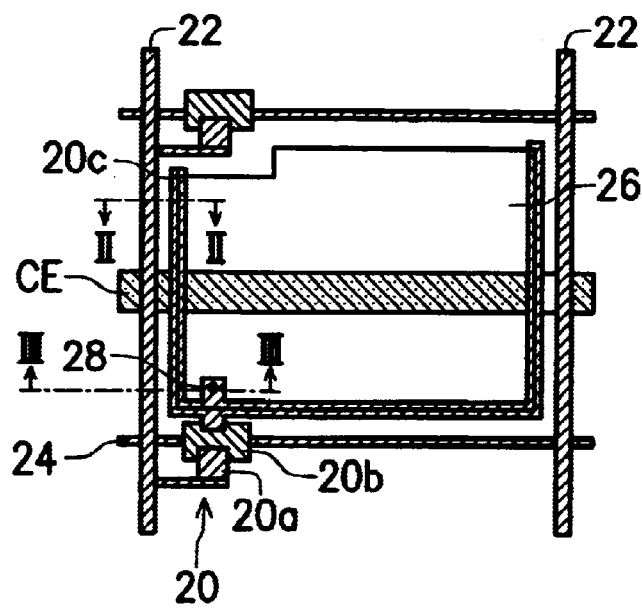
FIG. 2A is a plan view showing the structure of one pixel of a TFT structure according to one embodiment of the present invention.
Figure 2B:
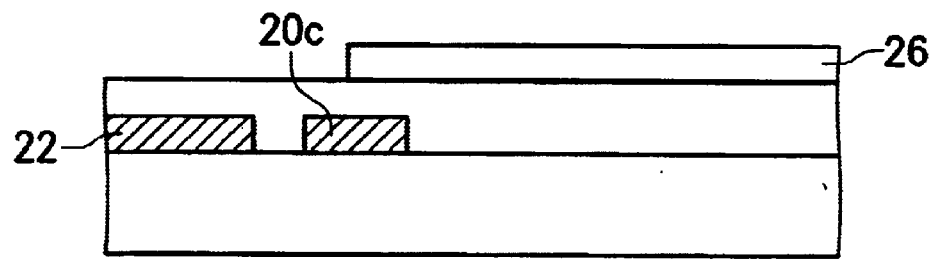
FIG. 2B is a cross-section according to a line II—II of FIG. 2A.
Figure 2C:
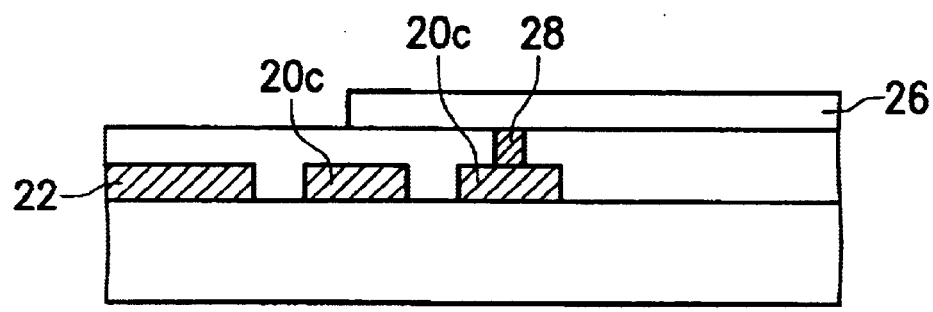
FIG. 2C is a cross section according to a line III—III of FIG. 2A.

FIG. 2A is a plan view showing the structure of one pixel of a TFT structure according to one embodiment of the present invention, and FIG. 2B is a cross-section according to a line II—II of FIG. 2A.

The TFT array structure comprises a Thin-Film Transistor 20, a data line 22, a scanning line 24, a pixel electrode 26 and a common electrode CE. The data line 22 is coupled to a drain electrode 20a of the Thin-Film Transistor 20, and the scanning line 24 is coupled to a gate electrode 20b of the Thin-Film Transistor 20 and crossed to the data line 22 to form a plurality of rectangular pixels in matrix. The pixel electrode 26 is constructed at each of the pixels and coupled to a source electrode of the Thin-Film Transistor 20 via a contact hole 28 which is formed on an isolated layer (not shown). A source electrode 20c of the Thin-Film Transistor 20 is extended to the region (both sides of the data line 22) where the pixel electrode 26 is next to the data line 22, and the edge of the pixel electrode 26 is disposed onto the source electrode 20c.

FIG. 2B is a cross-section according to a sectional line II—II of FIG. 2A. In FIG. 2B, it is understood that the capacitance-coupling effect is mainly generated between the data line 22 and the source electrode 20c. As the source electrode 20c and the data line 22 are formed on the same mask and the pixel electrode 26 is coupled to the source electrode 20c via a contact hole 28, the capacitance-coupling effect generated between the pixel electrode 26 and the data line 22 is the same as that generated between the source electrode 20c and the data line 22. Further, the distance between the source electrode 20c and the data line 22, located at the same mask, is constant, and the edge of the pixel electrode 26 is located above the source electrode 20c and located within the range of the source electrode 20c. Despite the distance between the pixel electrode 26 and the data line 22 being slightly uneven during the formation of the pixel electrode 26, the capacitance-coupling effect generated between the pixel electrode 26 and the data line 22 remains the same, based on the constant distance between the source electrode 20c and the data line 22.

Figure 3A:
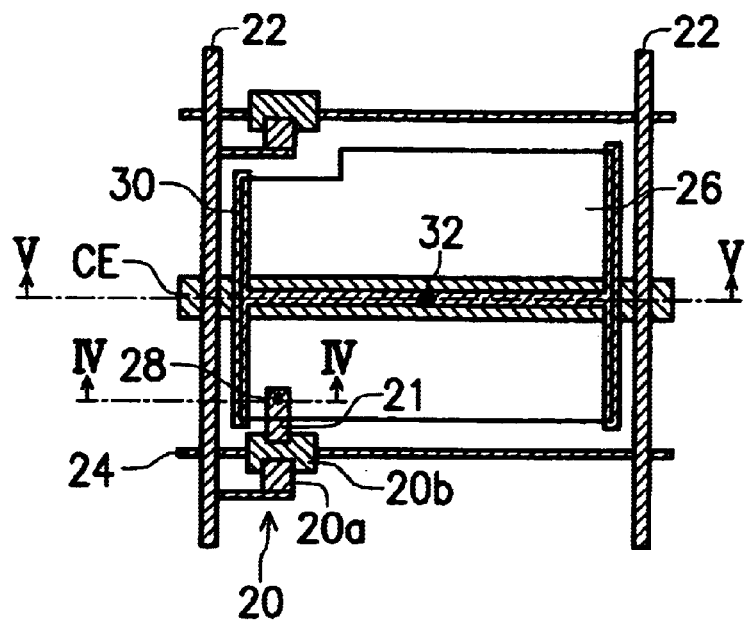
FIG. 3A is a plan view showing the structure of one pixel of a TFT structure according to another embodiment of the present invention.
Figure 3B:
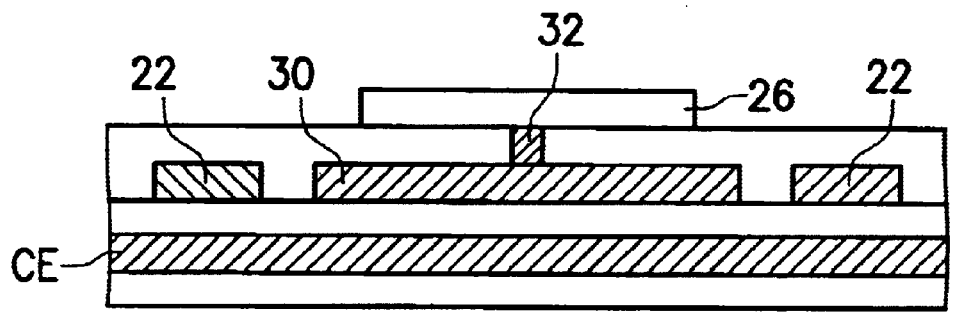
FIG. 3B is a cross section according to a line IV—IV of FIG. 3A.
Figure 3C:
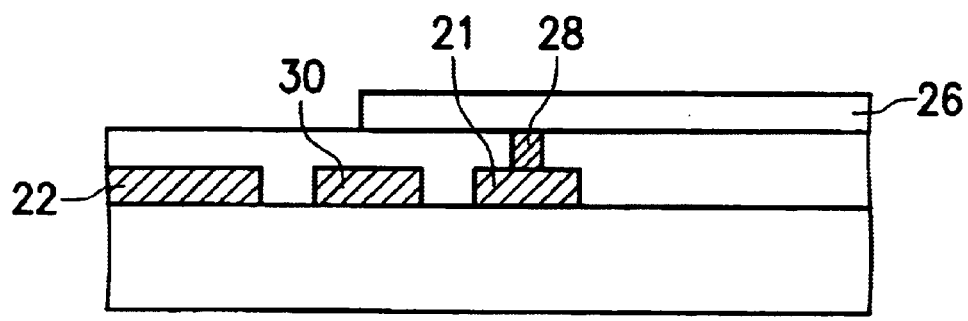
FIG. 3C is a cross section according to a line V—V of FIG. 3A.

FIG. 3A is a plan view showing the structure of one pixel of a TFT structure according to another embodiment of the present invention.

The TFT array structure comprises a Thin-Film Transistor 20, a data line 22, a scanning line 24, a pixel electrode 26 and an auxiliary electrode 30. The data line 22 is connected to the drain 20a of the Thin-Film Transistor 20, and the scanning line 24 is connected to the gate 20b of the Thin-Film Transistor 20. The scanning line 24 is oriented substantially orthogonally with respect to the data line 22 to form a plurality of rectangular pixels in matrix. The pixel electrode 26 is constructed at each of the pixels and coupled to a source electrode 21 of the Thin-Film Transistor 20 via a contact hole 28. The auxiliary electrode 30 is extended to the region (both sides of the data line 22) where the pixel electrode 26 is next to the data line 22, and the edge of the pixel electrode 26 is disposed onto the auxiliary electrode 30. The auxiliary electrode 30 is coplanar with the source electrode 21 and coupled to the source electrode 21 of the Thin-Film Transistor 20 via a contact hole 32.

Because the auxiliary electrode 30 is coupled to the source electrode 21 and the pixel electrode 26, the capacitance-coupling effect generated between the pixel electrode 26 and the data line 22 is the same as that generated between the auxiliary electrode 30 and the data line 22. The source electrode 20c and the data line 22 are located at the same mask and the distance between the auxiliary electrode 30 and the data line 22 is constant. Despite the formation of the pixel electrode 26 being uneven, the capacitance-coupling effect generated between the pixel electrode 26 and the data line 22 remains the same, based on the constant distance between the auxiliary electrode 30 and the data line 22.

The above pixel electrode 26 is generally an ITO (Indium Tin Oxide) electrode, and the material for forming the auxiliary electrode 30 is the same as the material for forming the source electrode 21. The source electrode 20c in the first embodiment is formed in a U-shaped structure, and the auxiliary electrode 30 in the second embodiment is formed in an H-shaped structure. It is characterized that a predetermined electrode (source electrode 20c or auxiliary electrode 30) is formed at the place where the pixel electrode is close to the edge of the data line. The predetermined electrode is coupled to the pixel electrode and located at a mask on which the data line is located. It is also characterized that the capacitance-coupling effect generated between the pixel electrode and the data line is the same as that generated between the predetermined electrode and the data line. The performances of all pixels are uniform despite errors occurring during the aligning process on the pixel electrode.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A Thin-Film Transistor array structure, comprising:
   a Thin-Film Transistor;
   a data line coupled to a drain electrode of the Thin-Film Transistor;
   a scanning line coupled to a gate electrode of the Thin-Film Transistor and crossed to the data line to form a plurality of rectangular pixels in matrix;
   a pixel electrode formed at each of the pixels and electrically connected to a source electrode of the Thin-Film Transistor,the pixel electrode having an edge parallel to the data line; and
   an auxiliary electrode electrically connected to the pixel electrode, wherein the edge of the pixel electrode is disposed on the auxiliary electrode.

2. The Thin-Film Transistor array structure as claimed in claim 1, wherein a pattern constructed by the auxiliary electrode, the source electrode and the data line is designed as a mask.

3. The Thin-Film Transistor array structure as claimed in claim 1, wherein the auxiliary electrode is formed in an H-shaped pattern.

4. The Thin-Film Transistor array structure as claimed in claim 1, wherein the pixel electrode is coupled to the source electrode via a contact hole.

5. The Thin-Film Transistor array structure as claimed in claim 1, wherein the auxiliary electrode is coupled to the pixel electrode via a contact hole.

6. The Thin-Film Transistor array structure as claimed in claim 1, wherein the auxiliary electrode is disposed adjacent and parallel to the data line, at a predetermined distance from the data line.

7. A Thin-Film Transistor array structure, comprising:
   a Thin-Film Transistor;
   a data line coupled to a drain electrode of the Thin-Film Transistor;
   a scanning line coupled to a gate electrode of the Thin-Film Transistor and crossed to the data line to form a plurality of rectangular pixels in matrix; and
   a pixel electrode formed at each of the pixels and electrically connected to a source electrode of the Thin-Film Transistor via a contact hole, wherein an edge of the pixel electrode is parallel to the data line and is disposed on the source electrode.

8. The Thin-Film Transistor array structure as claimed in claim 7, wherein a pattern constructed by the source electrode and the data line is designed as a mask.

9. The Thin-Film Transistor array structure as claimed in claim 7, wherein the source electrode is formed in a U-shaped pattern.

10. The Thin-Film Transistor array structure as claimed in claim 7, wherein a portion of the source electrode extends along and is parallel to the data line, at a predetermined distance from the data line.

11. A Thin-Film Transistor array structure, comprising:
    a Thin-Film Transistor having a drain electrode, a gate electrode and a source electrode;
    a first data line and a second data line, the first data line electrically connected to the drain electrode;
    a scanning line coupled to the gate electrode and crossing the first data line and the second data line;
    a pixel electrode arranged between the first data line and the second data line and electrically connected to the source electrode, the pixel electrode having a first edge and a second edge; and
    an auxiliary electrode having a first portion disposed adjacent and parallel to the first data line, arranged at a first predetermined distance from the first data line and electrically connected to the pixel electrode, and a second portion disposed adjacent and parallel to the second data line, arranged at a second predetermined distance from the second data line and electrically connected to the pixel electrode,
    wherein the first edge of the pixel electrode has a distance from the first data line greater than a distance between the first portion of the auxiliary electrode and the first data line, and the second edge of the pixel electrode has a distance from the second data line greater than a distance between the second portion of the auxiliary electrode and the second data line.

12. The Thin-Film Transistor array structure as claimed in claim 11, wherein a pattern formed by the first data line, the second data line, the first portion and the second portion of the auxiliary electrode is designed as a mask.

13. The Thin-Film Transistor array structure as claimed in claim 11, wherein the first portion and the second portion of the auxiliary electrode are electrically connected to the pixel electrode via the source electrode.

14. The Thin-Film Transistor array structure as claimed in claim 13, wherein the first portion and the second portion of the auxiliary electrode are an extended portion of the source electrode.

15. A Thin-Film Transistor array structure, comprising:
  a first pixel and a second pixel separately arranged in a first exposed block and a second exposed block, each of the first pixel and second pixel comprising:
    a first data line and a second data line separated by a predetermined distance,
    a pixel electrode arranged between the first data line and the second data line,
    a first electrode disposed adjacent and parallel to the first data line, arranged at a first predetermined distance from the first data line, and electrically connected to the pixel electrode, and
    a second electrode disposed adjacent and parallel to the second data line, arranged at a second predetermined distance from the second data line and electrically connected to the pixel electrode,
  wherein the first predetermined distance between the first electrode and the first data line at the first exposed block is the same as the first predetermined distance between the first electrode and the first data line at the second exposed block, and
  wherein the second predetermined distance between the second electrode and the second data line at the first exposed block is the same as the second predetermined distance between the second electrode and the second data line at the second exposed block.

16. The Thin-Film Transistor array structure as claimed in claim 15, wherein a pattern formed by the first data line, the second data line, the first electrode, and second electrode, at the first exposed block or the second exposed block, is designed as a mask.

17. A Thin-Film Transistor array structure, comprising:
  a first pixel and a second pixel separately arranged in a first exposed block and a second exposed block, each of the first pixel and second pixel comprising:
    a first data line and a second data line separated by a predetermined distance,
    a pixel electrode arranged between the first data line and the second data line,
    a first electrode disposed adjacent and parallel to the first data line, arranged at a first predetermined distance from the first data line, and electrically connected to the pixel electrode, and
    a second electrode disposed adjacent and parallel to the second data line, arranged at a second predetermined distance from the second data line and electrically connected to the pixel electrode,
  wherein a first capacitance-coupling effect between the pixel electrode and the first data line at the first exposed block is the same as a first capacitance-coupling effect between the pixel electrode and the first data line at the second exposed block, and
  wherein a second capacitance-coupling effect between the pixel electrode and the second data line at the first exposed block is the same as a second capacitance-coupling effect between the pixel electrode and the second data line at the second exposed block.

* * * * *